United States Patent [19]
Pammer

[11] 3,984,588
[45] Oct. 5, 1976

[54] SEMICONDUCTOR STRUCTURES AND METHOD OF PRODUCING

[75] Inventor: Erich Pammer, Munich, Germany

[73] Assignee: Siemens Aktiengesellschaft, Berlin & Munich, Germany

[22] Filed: Oct. 17, 1974

[21] Appl. No.: 515,604

[30] Foreign Application Priority Data
Oct. 17, 1973 Germany............................ 2352138

[52] U.S. Cl.................................. 427/88; 29/577; 29/590; 96/36.2; 96/38.4; 427/226
[51] Int. Cl.².................. H01L 21/88; H01L 21/94
[58] Field of Search............ 156/4, 13; 29/577, 578, 29/590, 591, 626; 96/34, 36.2, 38.4; 427/154, 226, 407, 88, 96

[56] References Cited
UNITED STATES PATENTS

| | | | |
|---|---|---|---|
| 3,020,156 | 2/1962 | Rowe..................................... | 96/38.4 |
| 3,222,173 | 12/1965 | Belko, Jr. et al. .................... | 96/36.2 |
| 3,443,944 | 5/1969 | Wise....................................... | 96/34 |
| 3,518,751 | 7/1970 | Waters et al........................... | 29/577 |
| 3,775,117 | 11/1973 | Hoffman et al......................... | 96/34 |
| 3,858,304 | 1/1975 | Leedy et al........................... | 96/36.2 |
| 3,936,531 | 2/1976 | Hofer.................................. | 427/226 |

Primary Examiner—Douglas J. Drummond
Assistant Examiner—Jerome W. Massie
Attorney, Agent, or Firm—Hill, Gross, Simpson, Van Santen, Steadman, Chiara & Simpson

[57] ABSTRACT

Semiconductor structures and a method of producing the same comprising coating the surface of a semiconductor body with a first inorganic insulating layer; coating an electrical conductor path on the first insulating layer; coating an organic layer which includes a compatible compound therein which vaporizes at a relatively low temperature onto select points or portions of the conductor path; coating a second inorganic insulating layer on all exposed surfaces of the conductor path, the organic layer and the first insulating layer; and heating the resulting structure to a temperature sufficient to vaporize the compatible compound within the organic layer and remove areas of the second insulating layer which superimposed the organic layer so as to unmask the select portions of the conductor path for access to external electrical connection means.

18 Claims, 1 Drawing Figure

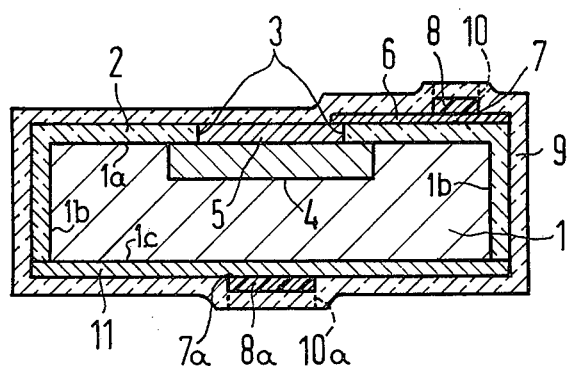

SEMICONDUCTOR STRUCTURES AND METHOD OF PRODUCING

BACKGROUND OF THE INVENTION

1. Field of the Invention

The invention relates to semiconductor structures and somewhat more particularly to semiconductor structures having a plurality of insulating layers one on top of the other with a conductor path therebetween along with unmasked contact points and methods of producing such semiconductor structures whereby select points of the conductor path are unmasked for access to external electrical connection means.

2. Prior Art

German Offenlegungsschrift No. 2,221,072, dated Nov. 9, 1972, suggests a method of producing a semiconductor structure wherein a surface of a semiconductor body is coated with a first organic insulating layer, a conductor path is provided on the first insulating layer, an organic intermediate layer is coated on select portions of the conductor path, a second inorganic insulating layer is coated on all exposed surfaces of the various layers and the entire structure is heated to relatively high temperatures sufficient to expand or oxidize the organic intermediate layer and remove the areas of the second insulating layer which superimposed the intermediate layer so as to unmask the select portions of the conductor path.

In practicing such prior art method, one may utilize, for example, a monocrystalline silicon disk or body in which one or more pn-junctions have been provided, such as by selective diffusion or implantation of doping material during the formation of p- or n-zones. A mask, preferably composed of $SiO_2$ may be applied onto such a disk to localize the penetration of the dopants at selected areas of the disk and such mask may remain on the finished structure as a first insulating protective layer on the surface of the semiconductor body and be provided with contact windows leading to individual zones or areas of the body for contact thereof by external electrical elements or the like. The electrodes which contact the individual zones of the semiconductor body in a blocking-free manner may then be inserted into appropriate contact windows in a conventional manner. Simultaneously, such insulating protective layer serves as a support for a conductor path leading to select electrodes of the semiconductor body.

In order to provide better protection for an arrangement as described above, it is known to completely cover such an arrangement with a second insulating layer, preferably also composed of an inorganic insulating material. The points of the conductor paths which are to be accessible for external electrical connection means must be uncovered or unmasked from the aforesaid second insulating layer. For this reason, German Offenlegungsschrift No. 2,221,072 suggests applying a layer of an organic polymer, i.e., a photo-resist or lacquer in a suitable pattern on the conductor paths, on those areas of the conductor paths which correspond to the connection points, and then temporarily overcoating such organic layer with the second insulating layer. Thereafter, when such a structure is heated, the organic or polymer layer expands or oxidizes and causes a peeling or removal of portions of the second insulating layer which were located directly above the polymer layer.

An alternative method of exposing or unmasking desired contact points involves the use of a photo-lacquer-etching technique. However, such an alternative method requires the use of liquid, such as a hydrofluoric acid-containing liquid, as an etching means. Such liquid etchants may accidentally etch through a conductor path as well as through the lowermost insulating layer. Further, such etchants have a tendency to expand between the two insulating layers due to capillary forces along the conductor paths and to corrode the conductor paths. The initially described method avoids these drawbacks.

However, the initially described method functions only with relatively large connection points, and even then, practical application thereof requires the use of ultrasonic vibrations and heating to temperatures of at least 520° C. so as to insure sufficient decomposition/vaporization of the organic or polymer layer and the removal of the overlying areas of the organic insulating layer.

SUMMARY OF THE INVENTION

The invention provides semiconductor structures having unmasked contact areas on the conductor paths thereof and a method of producing such semiconductor structures whereby the aforesaid drawbacks are substantially eliminated.

In accordance with the principles of the invention, a compatible compound which decomposes at relatively low temperatures below the decomposition/vaporization temperature of organic insulating materials is added to the intermediate organic layer and this mixture is coated onto select points or portions of a conductor path. Thereafter, such points are readily uncovered at low temperatures without adversely affecting the electrical properties of the structure. Such compatible compounds are selected from the class consisting of ammonium compounds having anions capable of forming non-corrosive gases, such as $NH_4NO_3$, $HCOONH_4$, $(NH_4)_2CO_3$, etc., organic nitro compounds, such as nitrocellulose or azo compounds such as azobenzene, easily decomposable polymer compounds, such as polyvinyl alcohol, peroxides, such as benzoyl peroxide and mixtures thereof.

BRIEF DESCRIPTION OF THE DRAWING

The single FIGURE of the drawing is an elevated cross-sectional, somewhat schematic view of a semiconductor structure being processed in accordance with the principles of the invention.

DESCRIPTION OF THE PREFERRED EMBODIMENTS

The invention provides semiconductor structures wherein insulating layers are arranged on top of one another and an electrical conductor path is provided between the two insulator layers, and unmasked contact points are provided on such conductor path for access to external electrical connection means and a method of producing such semiconductor structures which includes incorporating a compatible compound which decomposes/vaporizes at relative low temperatures between select points on the conductor path and the upper insulating layer so that by low temperature heating of such an arrangement predetermined areas of the upper insulating layer are removed and the select points on the conductor path are unmasked.

Generally, the compatible compounds are substantially inert to the metal of the conductor path and to the material of the two insulating layers. These compatible compounds are applied to select areas or points on the conductor path and beneath the top insulating layer, either as an additive to an organic insulating material, as a separate layer on top of a layer of such organic insulating material or directly on the conductor path. In at least some preferred embodiments of the invention, the compatible compounds or propellants (with or without suitable solvents therefor) are intermixed with the organic insulating material and this mixture is applied to select points of the conductor path. The amount of compatible compound is selected in such a way that even the conductor path points which are provided with the propellant or compatible compound are still mostly coated with the organic insulating material i.e., the compatible compound comprises a minority of the mixture and the organic insulating material comprises a majority thereof. After application, the resultant structure is subjected to relatively low temperature heating so as to cause decomposition/vaporization of such compatible compound and the development of non-corrosive gases which readily raise or lift areas of the upper insulating layer which lie directly above the areas provided with the compatible compound and unmasks the select areas of the conductor path.

The compatible compounds are selected from the class consisting of ammonium compounds having anions which yield non-corrosive gaseous components, organic nitro compounds, low temperature thermally decomposable organic polymer compounds, peroxides and mixtures thereof. Exemplary members of the ammonium compounds which are useful in the practice of the invention are:

ammonium nitrate ($NH_4NO_3$), which decomposes during heating and yields nitrogen (I) oxide, water vapor and oxygen;

ammonium formate ($HCOONH_4$), which decomposes during heating and yields water vapor, carbon monoxide and ammonium;

ammonium carbonate [$(NH_4)_2CO_3$], which decomposes during heating and yields ammonium, carbon dioxide and water vapors;

ammonium carbamate ($NH_2COONH_4$), ammonium acetate ($CH_3COONH_4$) and similar halogen and alkali-free ammonium compounds, such as ammonium bichromate. Exemplary members of the organic nitro compounds useful in the practice of the invention are nitrocellulose, azo compounds such as azo benzene, etc. An exemplary member of the peroxide compounds useful in the practice of the invention is benzoyl peroxide.

In instances where the compatible compound contains more oxygen than is required for its oxidation to gaseous $CO_2$ and $H_2O$ or a nitrogen oxide, respectively, such excess oxygen can effect a quicker and more complete "vaporization" of the base organic material forming the intermediate layer by the oxidation thereof into $CO_2$ and $H_2O$. The development of solid decomposition, distillation or cracking products is eliminated by such excess oxygen. The peroxide and nitro compounds useful in the practice of the invention are particularly suitable for yielding excess oxygen and such compounds may be used in admixture with one another for beneficial results, for example, with a photo-lacquer.

In embodiments where the compatible compound is not soluble in the organic material forming the intermediate organic insulating layer, such as a photo-resist or lacquer, suitable solvents such as $C_1 - C_4$ alkyl sulfoxides and/or formamides may be advantageously utilized. Preferably, such solvents comprise methyl sulfoxides or methyl formamides. Of course, the compatible compounds may be applied as a layer per se on the organic intermediate layer (but only on such organic layer and not on the surrounding material). Alternatively, the compatible compounds or additives may be intermixed in powdered form with the material forming the organic layer, i.e. lacquer, and this mixture be applied to select areas of the conductor path.

Referring now to the drawing wherein a typical semiconductor structure is shown undergoing various processing techniques, including those of the invention. As shown, a semiconductor body or disk 1, for example, comprised of silicon, is coated along select surfaces thereof (such as the upper surface 1a and side surfaces 1b, 1b, as shown), with a mask or first insulating layer 2, composed of an inorganic insulating material such as $SiO_2$. At least one window 3 is provided, for example, at the upper surface of layer 2, to provide access to the surface of the semiconductor body 1. By conventional implantation or diffusion means, a pn-junction 4 is produced below the window 3 with the aid of mask 2. After doping, an electrode 5, composed of, for example, aluminum, is provided within the window 3 and a conductor path 6, composed of, for example, aluminum, is provided on top of layer 2 and in contact with electrode 5. At a select point, such as outer point 7, of the conductor path 6, an organic layer 8, which is comprised of, for example, a photo-resist or lacquer which includes one or more of the aforementioned compatible compounds, is provided. As will be appreciated, one or more of such select points may be provided as desired along the conductor path whereby such points, after processing, provide access between the conductor path and external electrical connection means. Thereafter, all exposed surfaces of the organic layer 8, of the first insulating layer 2, as well as any exposed surfaces of the semiconductor body 1, are coated with a second insulating layer 9 at as low a temperature as possible. The layer 9 is composed of an inorganic insulating material, for example, $SiO_2$ or $Si_3N_4$ or $Al_2O_3$ or BeO and $Ta_2O_5$. The thickness of the second insulating layer 9 is generally dimensioned in a conventional manner to a value of about 0.1 to 2$\mu$m. The thickness of the organic layer 8 is about 0.5 to 4$\mu$m. In order to uncover or unmask the outer point 7, the soproduced structure is heated to a relatively low working temperature, generally below about 200° to 300° C. so that the compatible compound within the organic layer 8 decomposes and forms gases which cause a localized lifting or breaking-off of portion 10 of layer 9, which is above the point 7 on the conductor path 6.

Since the working temperature of the invention is substantially below the usually required temperature of 520° C. of the prior art, noticeable or disadvantages changes in the pn-junction characteristics are avoided and other disadvantages influences on the semiconductor structure are also avoided. The use of ultrasonics and/or high temperatures are not even required when it is necessary or desirable to provide relatively small access areas for external electrical connection means, such as area 10.

In embodiments which include a second electrode 11 on another surface of the semiconductor body 1 (such as on the bottom surface 1c as shown), the second insulating layer 9 may be applied over the electrode 11. Generally, it is advisable to cover select contact points such as 7a with an organic layer 8a before applying the layer 9, particularly if it is composed of $SiO_2$. During the relatively low temperature heating discussed earlier, a part of area 10a of layer 9 above layer 8a is removed and the corresponding area on the conductor path or electrode is exposed or unmasked.

Any residue of the organic layer 8 which may remain is readily removed with conventional solvents, such as acetone (which are substantially inert to the insulating material and/or conductor path material).

The organic layer is preferably composed of a mixture of a base or matrix material and the compatible compound (with or without a suitable solvent). The base or matrix material in the organic layer is preferably a photo-lacquer or resist, however, other organic insulating materials which are used in the semiconductor field may also be utilized. Photo-lacquers or resists are preferred because such materials can be applied in a simple and well defined manner. The amount of compatible compound to be intermixed with an organic base material may vary and generally depends on the viscosity of the resultant mixture which forms the organic insulating layer 8. If a photo-lacquer is utilized, for example, a larger amount of one or more of the hereinbefore discussed compatible compounds may be intermixed therewith. Heating of the polymeric substances (i.e. photo-lacquers) to high temperatures (i.e. above the working temperature of the compatible compound) prior to actual use should be avoided, if possible.

With the foregoing general discussion in mind, a detailed exemplary embodiment which will further illustrate to those skilled in the art the manner in which the invention is carried out is set forth. However, the exemplary embodiment must not be construed as limiting the scope of the invention in any way.

EXAMPLE

In this exemplary embodiment, the compatible compound tends to favor oxidation of the organic intermediate layer, particularly the photo-lacquer material.

1 gram of ammonium bichromate [$(NH_4)_2Cr_2O_7$] is dissolved in 20 milliliters of dimethyl formamide [$(CH_3)_2NOCH$]. 1 milliliter of this solution is mixed with 10 milliliters of photo-lacquer, which has an adjusted viscosity of about 200 centistokes. The resultant mixture is used as such in forming the organic intermediate layer. The working temperature of the ammonium bichromate is about 180° C. Accordingly, when a semiconductor structure as described hereinbefore contains this organic layer and is heated to its working temperature, the photo-lacquer is oxidized into gaseous compounds (i.e. $CO_2$, $NO_2$ and $H_2O$) at relatively low temperatures and only $Cr_2O_3$ remains as a solid residue on the contact point and is easily removed therefrom.

It is thought that the invention and its advantages will be understood from the foregoing description and it is apparent that various changes may be made in the process, form, construction and arrangement of the parts thereof without departing from the spirit and scope of the invention or sacrificing its material advantages, since the forms hereinbefore described and illustrated in the drawings merely comprise preferred embodiments.

I claim as my invention:

1. A method of producing a semiconductor structure comprising:
    coating at least one surface of a semiconductor body with a first inorganic insulating layer;
    placing a conductor path on at least a portion of said first inorganic insulating layer;
    coating select points of said conductor path with an organic layer which includes a compatible compound therein that is substantially inert to the materials forming the insulating layer and the material forming the conductor path, said compatible compound being thermally decomposable/vaporizable into non-corrosive gases at a temperature lower than the decomposition/vaporization temperature of any remaining material within said organic layer;
    coating all exposed surfaces of said first insulating layer, of said conductor path and of said organic layer with a second inorganic insulating layer; and
    heating the resultant structure to a temperature sufficient to decompose/vaporize said compatible compound and remove areas of said second insulating layer which superimposed the organic layer thereby unmasking the select points on said conductor path for access to external electrical connection means.

2. A method as defined in claim 1 wherein said compatible compound within the organic layer is an ammonium compound having an ion that forms a gaseous and non-corrosive material.

3. A method as defined in claim 2 wherein said ammonium compound is selected from the group consisting of ammonium acetate, ammonium carbamate, ammonium carbonate, ammonium bichromate, ammonium formate, ammonium nitrate and mixtures thereof.

4. A method as defined in claim 1 wherein said compatible compound within the organic layer is an organic nitro compound.

5. A method as defined in claim 4 wherein said organic nitro compound is nitrocellulose.

6. A method as defined in claim 4 wherein said organic nitro compound is an azo compound.

7. A method as defined in claim 6 wherein said azo compound is azo benzene.

8. A method as defined in claim 1 wherein said compatible compound within the organic layer is a peroxide compound.

9. A method as defined in claim 8 wherein said peroxide compound is benzoyl peroxide.

10. A method as defined in claim 1 wherein said organic layer is composed of a mixture of a photo-lacquer and said compatible compound.

11. A method as defined in claim 10 wherein said organic layer includes a suitable solvent for said compatible compound.

12. A method as defined in claim 11 wherein said suitable solvent is selected from the class consisting of $C_1 - C_4$ alkyl sulfoxides and $C_1 - C_4$ alkyl formamides.

13. A method as defined in claim 1 wherein said heating involves a temperature below about 200° to 300° C.

14. A method as defined in claim 1 wherein said organic layer is comprised of a mixture of ammonium bichromate, dimethyl formamide and a photo-lacquer.

15. A method as defined in claim 1 wherein said organic layer which includes said compatible compound is also composed of polyvinyl alcohol.

16. In a method of producing a semiconductor structure wherein a first inorganic insulating layer is coated on at least one surface of a semiconductor body, a conductor path is provided on at least a portion of the first insulator layer, an organic layer is coated on select points of the conductor path and a second insulating layer is coated over all exposed surfaces of the first insulating layer, of the conductor path and of the organic layer; the improvement comprising:

adding a compatible compound to the material forming said organic layer before said organic layer is covered with said second insulating layer, said compatible compound being substantially inert to the materials forming said first and second insulating layer and to the material forming said conductor path, said compatible compound being thermally decomposable/vaporizable into noncorrosive gases at temperatures below the decomposition/vaporization temperature of the remaining material forming said organic layer; and heating the resultant structure to a temperature sufficient to decompose/vaporize said compatible compound and remove areas of said second insulating layer which superimposed the organic layer so as to expose the select points of said conductor path for access to external electrical connection means.

17. In a method as defined in claim 16 wherein said compatible compound is selected from the class consisting of ammonium compounds having anions which form non-corrosive gaseous components, organic nitro compounds, decomposable/vaporizable organic polymer compounds, peroxide compounds and mixtures thereof.

18. In a method as defined in claim 16 wherein said organic layer is composed of a photo-lacquer which decomposes/vaporizes at temperatures of about 520° C. and said compatible compound is selected from the group consisting of organic nitro compounds, peroxide compounds and mixtures thereof.

* * * * *